United States Patent [19]
Chang et al.
[11] 3,865,654
[45] Feb. 11, 1975

[54] COMPLEMENTARY FIELD EFFECT TRANSISTOR HAVING P DOPED SILICON GATES AND PROCESS FOR MAKING THE SAME

[75] Inventors: Chi Shih Chang, Wappingers Falls; Teh-Sen Jen, Fishkill, both of N.Y.

[73] Assignee: International Business Machines Corp., Armonk, N.Y.

[22] Filed: Feb. 11, 1974

[21] Appl. No.: 441,073

Related U.S. Application Data

[62] Division of Ser. No. 302,962, Nov. 1, 1972, Pat. No. 3,821,781.

[52] U.S. Cl. .................... 148/187, 29/571, 307/310, 357/42, 357/44

[51] Int. Cl. .............................................. H01l 7/44

[58] Field of Search ....... 148/187; 29/571; 307/310; 317/235

[56] References Cited

UNITED STATES PATENTS

| | | | |
|---|---|---|---|
| 3,475,234 | 10/1969 | Kerwin et al. | 148/187 |
| 3,514,845 | 6/1970 | Legat et al. | 29/571 |
| 3,544,399 | 12/1970 | Dill | 148/187 |
| 3,576,478 | 4/1971 | Watkins et al. | 317/235 |
| 3,609,414 | 9/1971 | Pleshko et al. | 307/310 |
| 3,646,665 | 3/1972 | Kim | 148/187 X |
| 3,673,471 | 6/1972 | Klein et al. | 317/235 X |
| 3,682,724 | 8/1972 | Bohannon, Jr. | 148/187 X |
| 3,711,753 | 1/1973 | Brand et al. | 317/235 X |

OTHER PUBLICATIONS

Vadasz et al., "Silicon-gate Technology," IEEE Spectrum, Vol. 6, No. 10, Oct. 1969, pp. 28–35.
Faggin et al., "Silicon Gate Technology," Solid State Electronics, Vol. 13, 1970, pp. 1125–1144.

*Primary Examiner*—L. Dewayne Rutledge
*Assistant Examiner*—J. M. Davis
*Attorney, Agent, or Firm*—Thomas F. Galvin

[57] ABSTRACT

An insulated gate complementary field effect transistor integrated circuit uses silicon as the gate electrode. The gates of both N- and P- channel transistors are doped with P type impurities, thereby balancing the voltage threshold characteristics of the transistors.

After the P type diffusions are completed, a dip etch is used in the process to open the windows for the N type diffusions, thereby avoiding the necessity for applying photo-resist as a mask.

9 Claims, 16 Drawing Figures

COMPLEMENTARY FIELD EFFECT TRANSISTOR HAVING P DOPED SILICON GATES AND PROCESS FOR MAKING THE SAME

This is a division of application Ser. No. 302,962, filed Nov. 1, 1972, now U.S. Pat. No. 3,821,781.

BACKGROUND OF THE INVENTION

FIELD OF THE INVENTION

This invention relates to field effect transistors. In particular it relates to complementary field effect transistors formed as an integrated circuit which have silicon as the gate electrodes.

In recent years it has come to be recognized that complementary IGFET devices use substantially less power than standard IGFET devices. When combined with the use of a silicon gate rather than a metal gate, this type of transistor is an ideal compromise between switching speed and power dissipation. These silicon gate complementary IGFET circuits, as they are termed, have nanowatt quiescent power requirements and can operate at low supply voltages.

As pointed out in the article "Silicon Gate Technology" in *Solid State Electronics* 1970 pages 1125–1144, gate electrodes of polycrystalline silicon offer two advantages over standard metal gates: lower threshold voltages and lower capacitance. The work function of polycrystalline silicon can be made much closer to that of the channel inversion layer than can the work function of conventional metal; hence the thresholds are lower. In addition, because the silicon gate also functions as a self-aligning mask for the source and drain diffusions, the capacitance due to overlap of the gate with the source or drain is minimized. The use of the silicon gate has other advantages as well. For example, as compared to FET's with Al Gates, the P-doped polycrystalline silicon can also be used for interconnections in integrated circuits, thereby increasing circuit density.

Having realized the substantial advantages offered by complementary symmetry field effect transistors, designers in this field have been attempting to improve them for inclusion in systems where low power is essential. One of the problems inhibiting development of complementary symmetry devices has been to maintain an adequate noise margin while decreasing AC and DC power levels even further. To meet this criterion, it can be demonstrated that the magnitude of the threshold voltage, termed $V_T$, of the P and N channel devices which comprise the complementary IGFET circuit should be equal; i.e., $V_T$ for the N channel device should be as close to +1.0 volts as possible and $V_T$ of the P channel device should be as close to −1.0 volts as possible. In addition, it has been demonstrated that the signal delay through the device, which should also be as low as possible, is proportional to the difference between the power supply voltage on the devices and the threshold voltages of each device. Therefore, the smaller the threshold voltage, the shorter the signal delay.

Tailoring the threshold voltages of complementary devices to achieve this equality is by no means easy. The threshold voltages are functions of many parameters within the device. The threshold voltage of a field effect transistor is given in many reference books as follows:

$$V_T = \phi_{ms} - (Q_{eff}/C_I) \pm [2\ |\phi_F| + 1/C_{ox} \sqrt{4K\epsilon_o q\ N_b\ |\phi_F|}\ ] \quad (1)$$

where the plus in the plus or minus sign is used for a *N* channel device, the minus is used for a *P* channel device and:

$N_b$ = the doping density of the substrate;
$Q_{eff}$ = the equivalent oxide-silicon interface charge;
$\phi_F$ = the Fermi potential for the substrate;
$C_I$ = the capacity per unit area of the dielectric gate;
$\phi_{MS} = \phi_M - \phi_f$ = the work function potential difference between the gate electrode and the substrate;
$k\epsilon_o$ = the dielectric constant of the gate oxide
an q = the electronic charge. See, e.g., A. S. Grove, "Physics and Technology of Semiconductor Devices", 1967, pages 281 and 333.

The parameters in this expression which require substantial semiconductor process control and which therefore determine the final threshold voltage $V_T$ are the substrate doping level $N_b$ and the oxide charge $Q_{eff}$. In addition, if silicon is used as the gate electrode, the threshold voltage is affected by the work function $\phi_{MS}$.

Research in this field indicates that equalizing the magnitudes of the threshold voltages in prior art complementary FETs by controlling the substrate doping level is impractical. An impurity concentration in the P pocket which is an order of magnitude higher than the N substrate is required when aluminum or N-doped silicon is used as the gate electrode. This doping level deleteriously affects the threshold sensitivity of the device; and the speed of the device is made lower because the diffused junction capacitor, i.e., the capacitance between source/drain and substrate, is increased.

More recently, it has been suggested that the threshold voltages of complementary symmetry FET's could be shifted and controlled by doping the polycrystalline silicon gate electrodes with a suitable impurity. However, the conductivity type of the dopant for each polycrystalline gate is opposite that of the underlying semiconductor material. In other words, a P type gate is formed over N type silicon and a N type gate is formed over P type silicon substrate.

The above arrangement does not yield threshold voltages for each of the devices which are approximately equal in magnitude and suffers from the aforementioned high P pocket impurity concentration. In addition, this type of structure requires a contact which is attached in common to both silicon gate electrodes to avoid forming a PN junction between the electrodes.

SUMMARY OF THE INVENTION

It is therefore an object of this invention to improve the operation of complementary symmetry field effect devices.

It is a further object of this invention to equalize the magnitudes of the threshold voltages of the complementary devices.

It is still another object of this invention to improve the circuit density of complementary symmetry field effect devices formed in an integrated circuit.

These and other objects and advantages of the invention are achieved by doping the silicon gates of both the P and N channel devices with a P type impurity. The doping is preferably accomplished simultaneously with the diffusion of the P type source and drain regions in the P channel device. Polycrystalline silicon is the preferred material, although amorphous silicon could also be used.

The concentration of the P type impurity is chosen to insure a sheet resistance of from 30 to 100 ohms per square. The most preferred range is between 35 to 50 ohms per square. The most desirable dopant is boron diffused at a surface doping level of aroung $5 \times 10^{19}$ per $cm.^3$.

Circuit density of complementary monolithic circuits is increased with P doped silicon gates because the gates can be directly interconnected without the necessity of contact holes to other metallization, as is the case with N- and P- doped silicon.

The process for fabricating the complementary devices is simplified by using a dip etch instead of the usual photo-resist technique to open the windows for the N type diffusions after the P-type diffusions have been completed.

BRIEF DESCRIPTION OF THE DRAWING

FIGS. 1*a* –1*m* are cross-sectional views of a portion of a complementary symmetry field effect device fabricated according to the present invention.

DESCRIPTION OF THE PREFERRED EMBODIMENT

Referring now to the figures, the fabrication of the present field effect transistor circuit will be described. The present invention is concerned primarily with the doping of the polysilicon gate electrodes and the process used to attain them. However, for a complete understanding of the invention it is necessary to discuss the fabrication of the source and drain regions, the gate structure, the insulation for the gate and the necessary electrical contacts to the source, drain and gate although many of these steps are by this time wellknown to those of skill in the art.

Figure 1A:
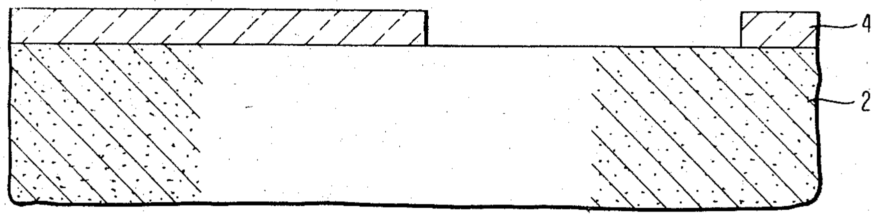
Figure 1B:
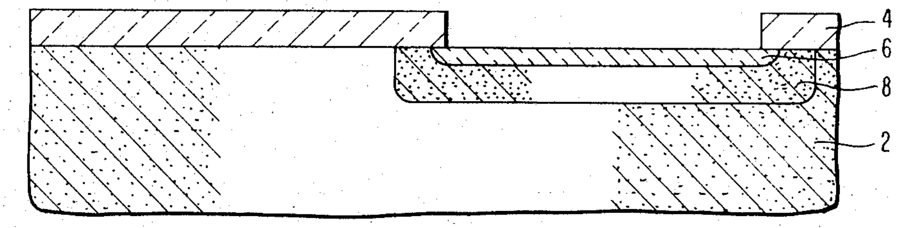

FIG. 1*a* shows a semiconductor body 2 which is shown as N-type silicon, for example, having a typical resistivity of about 10 ohms-cm. A surface of the semiconductor body 2 is provided initially with an overall masking layer 4 having an aperture therein in which the p pocket of a N channel device will be fabricated in succeeding steps. The insulator 4 is preferably pyrolytically deposited silicon dioxide having a thickness of around 1.5 $\mu$M. Other techniques could be used to form the oxide and other types of masking layers could be used if desired.

The next step in the process is the formation of a screening oxidation layer 6 which is preferably in the range of 500–2,000 A thick. This layer is typically formed by heating the silicon body 2 in steam until a layer of silicon dioxide of the desired thickness is obtained. After the screening oxidation step has been completed, a P type pocket 8 is formed within the aperture and below the oxidation layer 6. In the preferred process, boron at a dosage of $1.8 \times 10^{13}$ per $cm^2$ is ion-implanted into the semiconductor substrate. At an implanting energy of 150 kev, this results in an implanting depth, $R_p$ of around 5,000 A.

At this point it should be noted that a standard diffusion process might be used for forming the P pocket 8 using standard photoresist techniques and omitting the formation of the screening oxidation layers 6. However, it has been found that a more constant diffusion level throughout the P pocket can be achieved by ion implantation techniques.

Figure 1C:
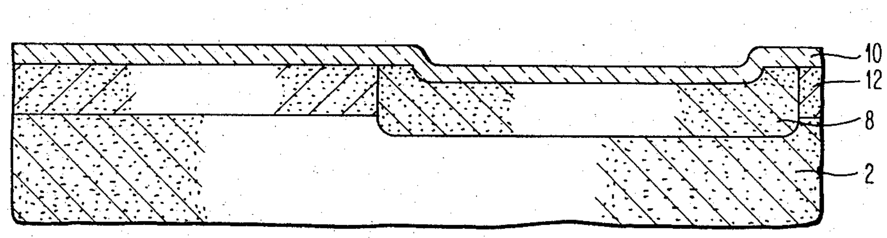

For the next step in the process the oxide layers 4 and 6 are stripped by conventional techniques from the substrate 2. Then, as shown in FIG. 1*c*, a screening oxidation is performed to form an oxide layer 10 of around 500 A over the entire surface of substrate 2. This step also causes a partial drive-in of p pocket 8. A N type impurity is then deposited in areas 12 adjacent P pocket 8. Preferably this is performed by masking region 8 with a photoresist and then ion-implanting phosphorus in areas 12 to a depth of around 2,500 A below the screen oxide 10. Typically, this is accomplished by a dosage of $7 \times 10^{11}$ per $cm^2$ of phosphorus impurity applied at 150 kev to form N "skin" regions 12.

Figure 1D:
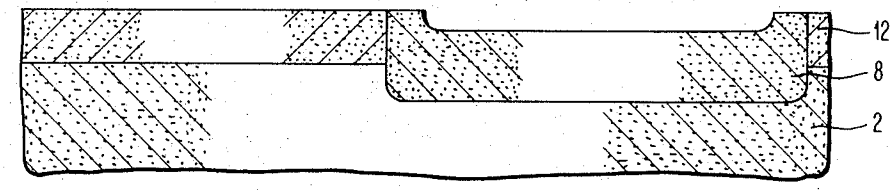

FIG. 1*d* illustrates the final step in preparing the substrate 2 for the formation of the complementary FET's. The P pocket 8 and the N-skin 12 are now subjected to a drive-in cycle. This is accomplished by the standard technique of heating for about three hours at 1,150°C in an atmosphere of nitrogen. At this point the skin layer 12 of N type impurity has a diffusion level of $1 \times 10^{16}$ per $cm^3$ to a depth of around 1.5$\mu$m and the p pocket has a diffusion level of around $4 \times 10^{16}$ per $cm^3$ at a depth of around 3$\mu$m.

The preparation of the substrate to achieve the device shown in FIG. 1*d* can be accomplished by other techniques. For example, if it were desired, the N type substrate could be doped to have a resistivity of around 0.5 ohm-cm. This provides the proper impurity level for the p channel device area. The P pocket is formed in the usual manner and the drive-in step is applied to the P pocket only. Another technique involves outdiffusion of a P region from a substrate into a N type epitaxial layer. Other techniques for forming the P pocket and the N layer at the surface of the substrate will occur to those of skill in the art and could be used with equal effectiveness in the present invention.

Figure 1E:
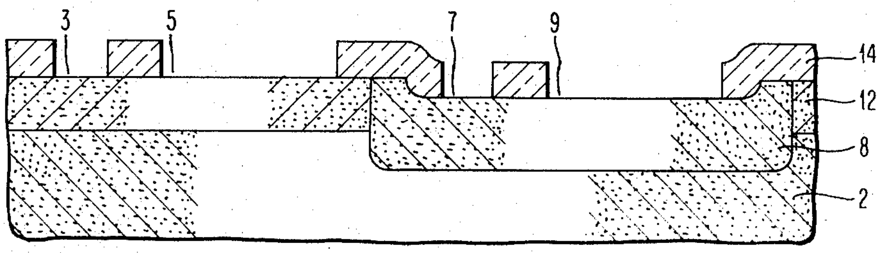

Returning now to the figures, FIG. 1*e* shows an oxide layer 14 which has been grown, preferably by thermal oxidation or pyrolytic oxidation to a depth of around 7,000 A atop the surface of the substrate 2. As shown in FIG. 1*e* oxide layer 14 has been selectively etched to leave openings at apertures 3 and 7 for contacts to the N layer 12 and the P pocket 8, respectively. Openings 5 and 9 are for the fabrication of the P- and N- channel complementary devices, respectively.

Figure 1F:
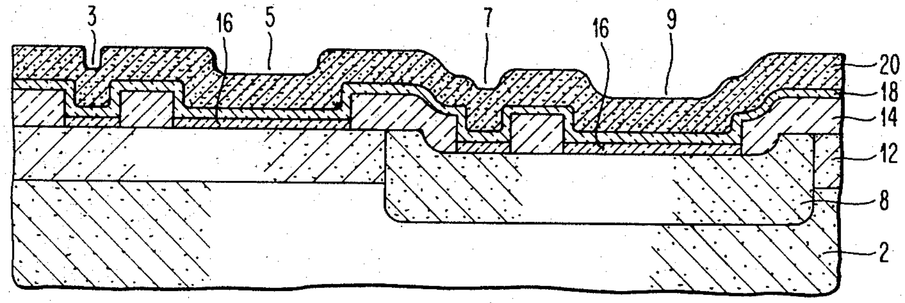

FIG. 1*f* illustrates the deposition of dual insulating layers 16 and 18 and a layer 20 of polycrystalline silicon atop the insulating layers. Layer 16 comprises around 300 A of silicon dioxide; layer 18 comprises around 300 A of silicon nitride; and layer 20 is preferably between 5,000 A and 8,000 A of polycrystalline silicon. The techniques for depositing these materials atop a semiconductor substrate are well known to those of skill in the art and further detail is deemed to be unnecessary at this point in time.

Figure 1G:
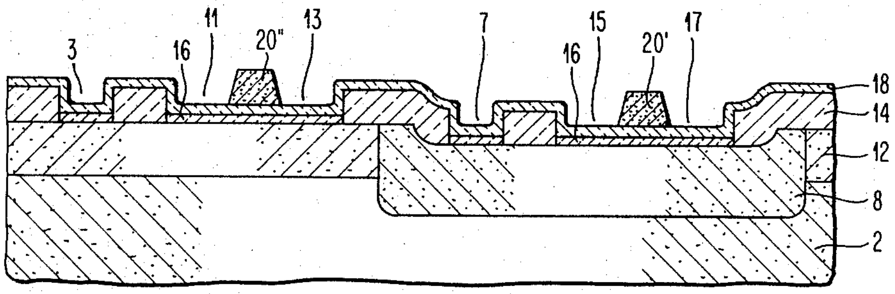

In FIG. 1*g* the polysilicon gates 20′ and 20″ are patterned atop the apertures 5 and 9 in the substrate. Areas 11 and 13 will be utilized in a subsequent step for the formation of the source and drain regions of the P channel device; and areas 15 and 17 will comprise the source and drain of the N channel device. The patterning of the polysilicon gates 20' and 20'' may be performed by first oxidizing the entire polysilicon layer 20. Subsequently, a photoresist layer may be applied and the oxide selectively etched from the upper surface of the polysilicon layer except in those locations where it is desired to have the polysilicon gate. The polysilicon is then etched away except in those areas where it is protected by the oxide layer. After the excess polysilicon is removed, the oxide atop the polysilicon gates 20' and 20'' may be removed by a dip etch. Silicon nitride layer 18 will protect the remainder of the substrate from the etchant.

Figure 1H:
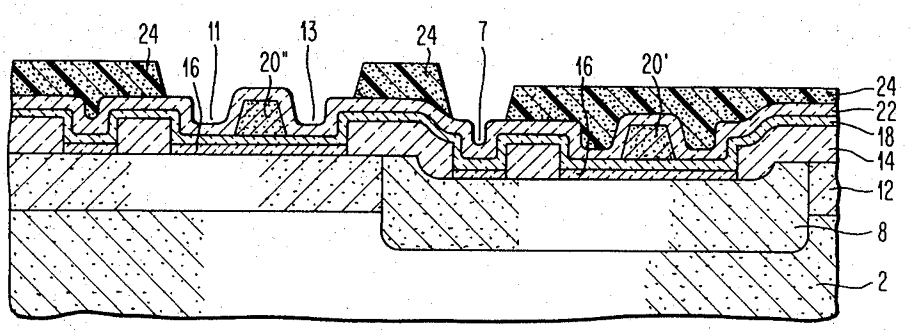

FIG. 1*h* shows the next step in the process in which a pyrolytically deposited oxide layer 22 is deposited on the entire substrate and photoresist layers 24 are patterned to open apertures 11, 13 and 7 which will comprise the P type diffusion areas in the circuits.

Figure 1I:
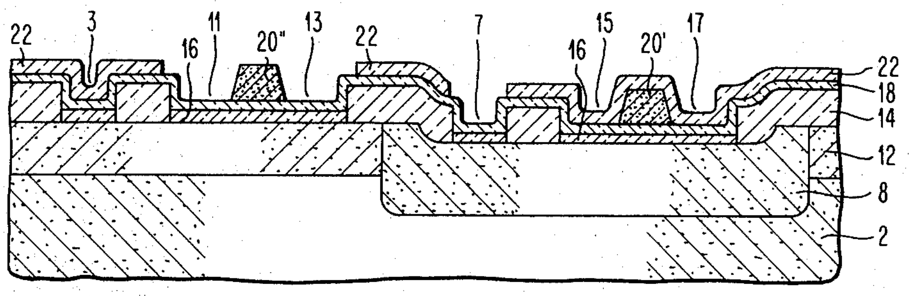

In FIG. 1*i* oxide layer 22 has been removed from the substrate in those locations where the P type diffusion areas are needed. After the oxide layer 22 has been selectively etched layers 24 are removed, the apertures 3, 15 and 17 being protected by oxide layers 22. Thus, the P type diffusion windows 11, 13 and 7 are covered by thin nitride layer 18 and thin oxide layer 16 whereas the N type diffusion windows 3, 15 and 17 are also covered by the oxide layer 22 which is around 1,000 A thick.

Figure 1J:
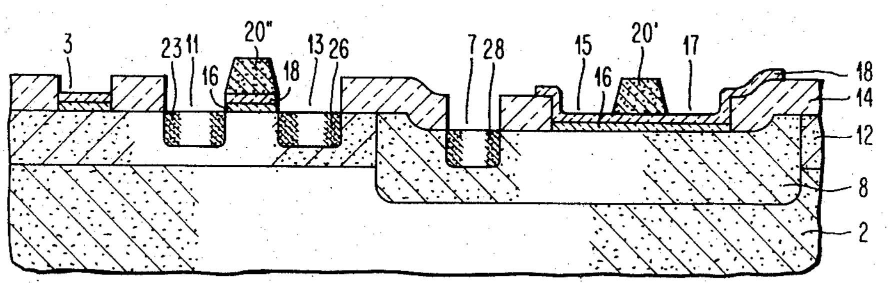

A hot phosphoric acid etch which attacks the nitride layer 18 but which does not attack the oxide layer 22 is then applied to the substrate. This removes the nitride layer from all regions of the substrate except where it is covered by the oxide layer 22. Subsequently a buffered HF etch is applied to the substrate, removing oxide layer 22 and those regions of oxide layer 16 which are not still covered by the nitride layer 18. As shown in FIG. 1*j* these steps cause the diffusion regions 3, 15 and 17 to remain protected by the thin nitride and oxide layers whereas apertures 11, 13 and 7 are opened for a subsequent diffusion step. In addition, the polysilicon gates 20' and 20'' are also open for the diffusion of a P type impurity.

Thus at this point, the polysilicon gates 20' and 20'', the drain and source regions 23 and 26 of the P channel device, and the P-pocket contact region 28, can be doped by a P type impurity which in this preferred embodiment is B $Br_3$. The doping level of the boron is preferably around $5 \times 10^{19}$ per $cm^3$ at a depth, $X_j$, of around 50 microinches in the windows 11, 13 and 7. The polycrystalline silicon gates 20' and 20'', which when initially deposited are essentially intrinsic, also become highly doped to form $P^+$silicon gates. This step is a critical part of the present invention. As previously noted, the doping of the gates of both the N and P channel devices with a $P^+$ impurity makes the threshold voltages of each device virtually equal in magnitude. In addition, the doping is accomplished in the same step as the diffusion of the source and drain regions of the P channel device, thereby accomplishing the fabrication in the usual number of masking steps which would have been required without the doping of the gates.

Figure 1K:
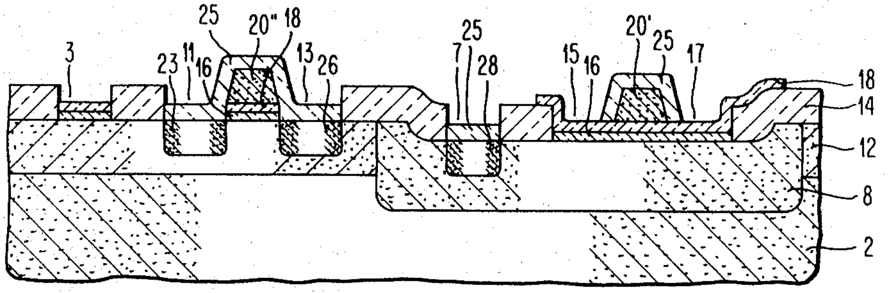
Figure 1L:
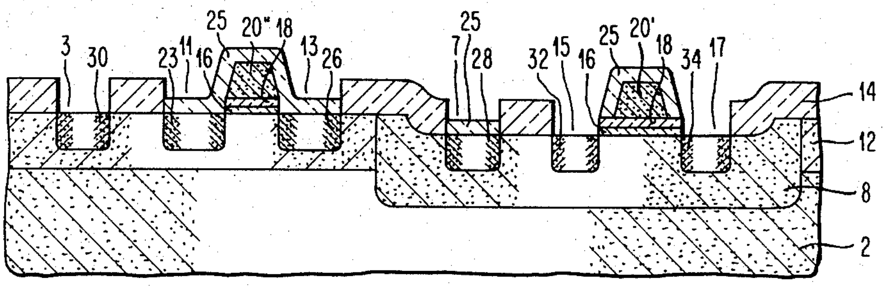

As illustrated in FIGS. 1*k* and 1*l*, the formation of the N type diffusions in windows 15, 17 and 3 is accomplished by the steps of oxidizing the areas of the previous P type diffusion with an oxide layer 25 and dip-etching the silicon nitride layer 18 and the thin oxide layer 16 from the apertures 3, 15 and 17. The oxide layer 25 is around 1,500 A thick, which is substantially thicker than the 300 A oxide layer 16. By means of the dip etch technique, the usual steps of photo-resist application, selective hardening and removal and complete removal after diffusion are eliminated. The dip-etching may be performed by first immersing the device in hot phosphoric acid to remove nitride layer 16 and then in buffered HF for a time sufficient to remove oxide layer 18 but insufficient to remove thick oxide layer 25. Thus in the etching step which removes the oxide layer 16 from apertures 15, 17 and 3, oxide layer 25 is substantially unaffected as a mask for subsequent phosphorus diffusion.

In FIG. 1*l* N type diffusions 30, 32 and 34 are made at the appropriate areas in the substrate. In the preferred embodiment the N diffusion is performed by a vapor diffusion of phosphorus oxychloride. The phosphorus is subsequently subjected to a drive-in cycle. At this point the device is essentially complete. The remaining steps, which are not illustrated, would comprise the deposition of pyrolitic oxide, the opening of contact hole and the evaporation of metallurgy at the surface of the substrate for appropriate connection into an operative circuit. These steps are deemed not to be requisite for an understanding of the present invention.

Figure 2A:
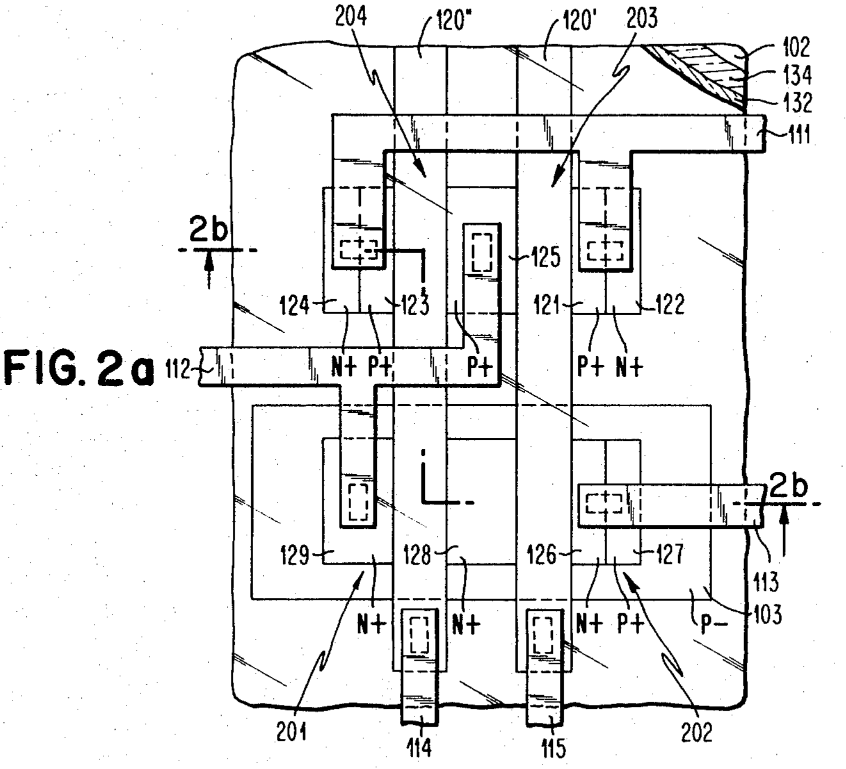
FIGS. 2 and 2*a* are top and cross-sectional views respectively of another complementary symmetry field effect device fabricated according to the present invention.
Figure 2B:
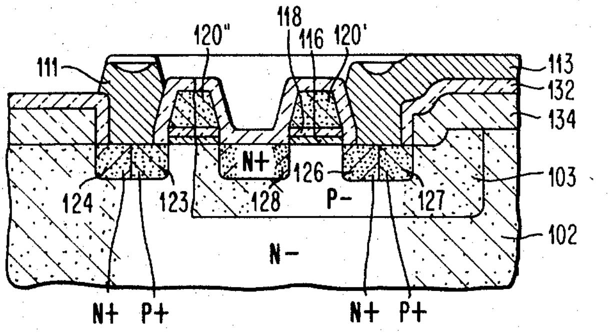
Figure 3:
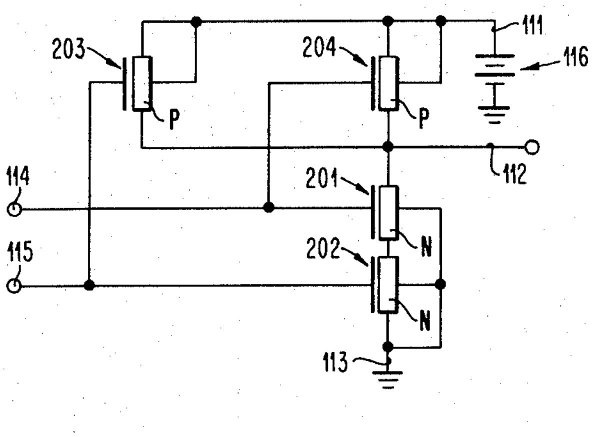
FIG. 3 is a circuit diagram of the device illustrated in FIGS. 2 and 2*a*.

FIGS. 2*a* and 2*b* and FIG. 3 illustrate a circuit containing FET devices using the P doped polycrystalline silicon gate electrodes of this invention. FIG. 2*a* shows a schematic top view of a two-way NAND circuit. This NAND gate contains in the semiconductor substrate 102 an area of P type material 103. Formed within the P pocket 103 are a pair of N channel field effect transistors. The first transistor 202 comprises N+ region 126 and N+ region 128 plus a polysilicon gate 120' overlying insulation layers 118 and 116. A heavily doped P+ region 127 is diffused as a contact to the P pocket 103. Regions 126 and 127 are connected to ground potential through a contact to metallization 113 overlying the substrate. N channel transistor 201 comprises N+ doped regions 128 and 129 and gate elecctrode 120''.

The P channel devices 203 and 204 are formed in a similar fashion in the N substrate 102. Transistor 203 comprises P+ regions 121 and 125 as the source and drain regions and polycrystalline silicon layer 120' as the gate region. Transistor 204 comprises P region 123, gate electrode 120'' and P region 125. By means of appropriate contacts through windows in insulation layers 132 and 134, the source regions of transistors 203 and 204 as well as the N+ regions 122 and 124 are connected by metallization 111 to a source of positive potential 116. The drain regions of transistors 203 and 204 as well as the drain of N channel transistor 201 are connected via metallization 112 as the output of the circuit. FIG. 3 shows the circuit schematic of the integrated circuit illustrated in FIGS. 2*a* and 2*b*. When used as a two way NAND gate, metallization 114 and 115 serve as input leads to the device while metallization 112 serves as the output lead from the device. The source and substrate regions of P channel devices 203 and 204 are connected via lead 111 to voltage source 116 which is typically around 2 to 10 volts. The drain regions of the P channel devices 203 and 204 as well as the drain of N channel device 201 are connected to output lead 112. The devices are enhancement mode devices; i.e., normally nonconducting.

To illustrate the operation of the circuit, assume that positive signals or up levels are applied to input leads 114 and 115. The regions beneath the gates of N type FET's 201 and 202 invert and create channel regions in which minority carriers predominate between the source and drain of each transistor; thus both transistors 201 and 202 conduct at the down level. The same input levels on leads 114 and 115 hold the P channel transistors 203 and 204 off, thereby providing a high load resistance between the potential 116 and the output. At this point the output lead is at ground potential.

When either input is up and the other is down, the corresponding N channel devices are on and off, respectively, and the path from ground to the output through the N channel transistors is open. However, either P channel transistor 203 or 204 is rendered conductive, depending on which input is at the down level, and current is drawn from source 116 to the output at the up level. When both inputs are at a down level simultaneously, both N channel transistors are cut off and both P channel transistors turned on and the output is also at the up level.

Although the circuit in FIG. 3 is well-known in the art and does not form any part of the present invention, it has been described to better illustrate the present invention. As has been previously pointed out, by doping the gates of both the P and N channel devices with a P type impurity, the magnitudes of the threshold voltages of the devices are made substantially equal. Therefore, the value of the supply voltage 116 can be chosen to be lower than would be possible if the magnitude of the threshold voltages of the devices were different. This results in lower power dissipation than in previous devices and also insures minimal signal delay through the circuit for a particular power supply voltage.

Figure 4:
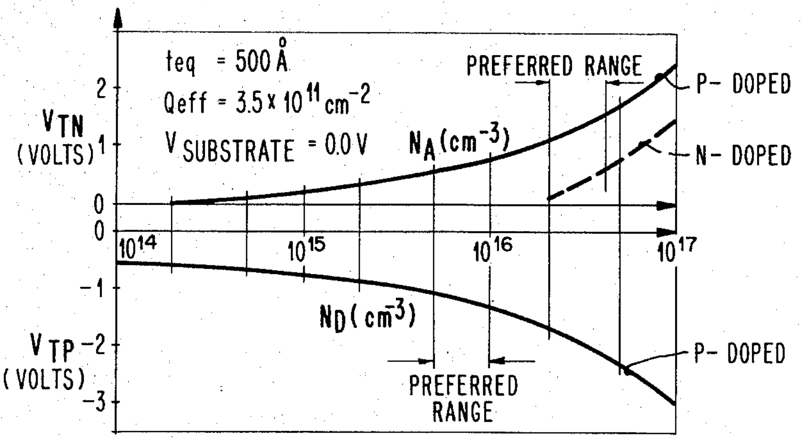
FIG. 4 is a graph illustrating the threshold voltage vs. doping levels of the devices fabricated according to the present invention as compared to prior art devices.

FIG. 4 illustrates the improved results obtained with P-doped silicon gates. The upper half of the graph is a plot of the threshold voltage in the N channel device versus the impurity level in the P pocket. The lower half is a similar plot for the P channel device. As will be seen from FIG. 4, the threshold voltages of the P and N channel complementary devices are substantially equal in magnitude if the P pocket of the N channel device has an impurity level around 2 to 4 $\times 10^{16}$ atoms/$cm^3$ and the N region of the P channel device has an impurity level of around $5 \times 10^{15}$ to $1 \times 10^{16}$ atoms/$cm^3$.

For the same circuit having a N doped, rather than a P-doped, silicon gate over the N channel device, the impurity level in the P pocket must be around $7 \times 10^{16}/cm^3$ or higher. This substantially higher doping level causes an undesirable increase in the substrate sensitivity of the threshold voltage and also increases the diffused junction capacitance, thereby lowering the switching speed of the device.

There is another advantage of doping all of the gates of the integrated circuit with a P-type impurity only. In devices having both P- and N-type impurities diffused into the gates, the interconnection of the gate lines atop the semiconductor surface requires contact openings to the gates which are connected by a metal conductive line, such as the standard aluminum metallurgy. If this were not done, a P/N junction would be formed at the intersection of the N- and P-type silicon gate lines. Such contacts are totally unnecessary when only P-doped silicon gates are used. The gates can be directly interconnected, thereby allowing the device designer to achieve a higher circuit density for a given semiconductor area.

While the invention has been described in terms of a particular process for fabricating the complementary transistor device in integrated form, it has been pointed out previously that other processes for forming the P and N regions within the substrate could be used. In addition the preferred process described for forming the gate and drain and source regions is commonly termed the self-aligned gate process whereby the gate is first formed over a region and the drain and source are then formed on each side of the gate. However, the invention is not limited to this particular process and would operate satisfactorily if the source and drain were formed prior to the gate. Finally, while the particular type of circuit used to better describe the invention has been in terms of a two-way NAND gate, other more or less complicated complementary integrated circuits using P doped gates are comprehended by the present invention.

We claim:

1. In the method for forming a complementary pair of field effect transistors which include a semiconductor substrate having regions therein for N and P channel devices and silicon gate electrodes for said devices, the improvement comprising:

doping both said gate electrodes with a P-type impurity; and forming the P-type source and drain regions of said P channel device simultaneously with said doping of the gate electrodes.

2. A method as in claim 1 including forming the source and drain regions of the N channel device comprising the steps of:

covering the gate electrodes and the P channel source and drain regions with a thick insulation layer;

dip-etching the masking layer over the source and drain regions of the N channel devices thereby removing the masking layer over the N channel devices;

diffusing a N type impurity into said N channel source and drain regions, the thick layer over the P channel source and drain regions and the gate electrodes remaining substantially intact as a diffusion mask.

3. A method as in claim 2 wherein said masking layer over said N channel source and drain regions comprise relatively thin layers of silicon dioxide and silicon nitride and said thick layer comprises silicon dioxide.

4. A method as in claim 3 wherein said dip etching is accomplished by the steps of:

etching the nitride layer in hot phosphoric acid; and etching the thin oxide layer in buffered hydrofluoric acid for a time sufficient to remove the thin oxide layer, but insufficient to affect the thick oxide layer as a diffusion mask.

5. A method for fabricating in a silicon semiconductor substrate a complementary pair of field effect transistors having substantially equal threshold voltage characteristics comprising the steps of:

forming a region of P conductivity type with an impurity level between $2\text{–}4 \times 10^{16}/cm^3$;

forming a region of N conductivity type with an impurity level between $5 \times 10^{15}$ and $10^{16}/cm^3$;

forming layers of silicon dioxide over selected channels of each said region;

forming silicon nitride layers over each of said silicon dioxide layers;

forming silicon layers having P type conductivity over each said silicon nitride layer; and forming source and drain regions of N and P conductivity types adjacent to said channels P and N type substrate regions, respectively.

6. A method as in claim 5 wherein said P type source and drain regions are formed simultanoeusly with the doping of the gate electrodes.

7. A method as in claim 5 wherein the formation of said N type source and drain regions comprise the steps of:

covering said gate electrodes and said P type source and drain regions with a thick insulation layer;

dip-etching the masking layer over the source and drain regions of the N channel device, thereby removing the masking layer over said N channel device;

diffusing an N type impurity into said N channel source and drain regions, and the gate electrodes remaining substantially intact as a diffusion mask.

8. A method as in claim 7 wherein:

said masking layer over said N channel source and drain regions comprise relatively thin layers of silicon dioxide and silicon nitride; and said thick layer comprises silicon dioxide.

9. A method as in claim 8 wherein said dip-etching is accomplished by the steps of:

etching said nitride layer in hot phosphoric acid; and etching said thin oxide layer in buffered hydrofluoric acid for a time sufficient to remove the thick oxide layer, but insufficient to effect the thick oxide layer as the diffusion mask.

* * * * *

UNITED STATES PATENT OFFICE

CERTIFICATE OF CORRECTION

PATENT NO. : 3,865,654

DATED : February 11, 1975

INVENTOR(S) : Chi Shih Chang Et Al

It is certified that error appears in the above-identified patent and that said Letters Patent are hereby corrected as shown below:

Column 2, line 14 (In the Specfication Page 4, line 1) "- an q =" should read...and q =.

Signed and Sealed this

*thirtieth* Day of *September 1975*

[SEAL]

*Attest:*

RUTH C. MASON
*Attesting Officer*

C. MARSHALL DANN
*Commissioner of Patents and Trademarks*